United States Patent [19]

Pezzani

[11] Patent Number: 5,365,086

[45] Date of Patent: Nov. 15, 1994

[54] THYRISTORS HAVING A COMMON CATHODE

[75] Inventor: Robert Pezzani, Vouvray, France

[73] Assignee: SGS-Thomson Microelectronics S.A., Saint-Genis Pouilly, France

[21] Appl. No.: 140,749

[22] Filed: Oct. 21, 1993

[30] Foreign Application Priority Data

Oct. 29, 1992 [FR] France .................. 92 13340

[51] Int. Cl.$^5$ .......................................... H01L 29/00
[52] U.S. Cl. ........................... 257/157; 257/175; 257/167; 257/162
[58] Field of Search ............... 257/175, 167, 162, 122, 257/123, 107, 152, 153, 157, 119

[56] References Cited

U.S. PATENT DOCUMENTS

| | | | |
|---|---|---|---|
| 4,163,241 | 7/1979 | Hutson | 257/132 |
| 4,939,564 | 7/1990 | Asakura et al. | 257/175 |
| 4,956,690 | 9/1990 | Kato | 257/162 |
| 4,994,884 | 2/1991 | Kato et al. | 257/167 |

FOREIGN PATENT DOCUMENTS 1580490 12/1980 United Kingdom.

*Primary Examiner*—Jerome Jackson
*Assistant Examiner*—John Guay
*Attorney, Agent, or Firm*—Wolf, Greenfield & Sacks

[57] ABSTRACT

A thyristor comprised of a vertical thyristor including, on its front surface, a localized anode region, and on its rear surface, a cathode metallization substantially coating the whole rear surface region, and, on its front surface region, a lateral thyristor. The thyristor gate corresponds to the cathode region or to the cathode-gate region of the lateral thyristor. The cathode-gate region or cathode region, respectively, of the lateral thyristor is connected to the cathode of the vertical thyristor.

15 Claims, 5 Drawing Sheets

THYRISTORS HAVING A COMMON CATHODE

BACKGROUND OF THE INVENTION

1. Field of the Invention

The present invention relates to a thyristor structure and to a monolithic assembly of thyristors having common cathodes and common gates, the gates being biased with respect to the cathodes.

2. Discussion of the Related Art

FIG. 1 schematically represents a conventional thyristor structure formed from an N-type substrate N2 having a thickness of several hundred microns. A P-type layer P2 is uniformly formed on the lower side of the substrate and corresponds to the thyristor anode, coated with an anode metallization A. On the side of the upper surface a P-type region P1 is formed, corresponding to a cathode gate layer in which a N-type cathode region N1 is formed. A metallization G is integral with the gate region; a metallization K is formed on region N1 and forms the cathode electrode. Interruptions of region N1 that correspond to conventional emitter shorts, are also represented.

At the periphery of the thyristor, from the upper and lower surfaces P-type, diffusions 2 and 3 are formed to provide a structure that is commonly referred to as a well thyristor structure.

In such a structure, it is the anode surface that can be mounted on a heat sink and that corresponds to the side of the cooling system of the thyristor and also, generally (except in insulated circuits), to the heat sink voltage. With such a structure, several thyristors having common anodes can be easily integrated in parallel.

In such thyristors, the gate is biased with respect to the cathode. That is, the thyristor becomes conductive if, while its anode is positive with respect to its cathode, a positive voltage is applied between its gate and its cathode to allow a current to flow from the gate to the cathode.

For a long time, manufacturers of thyristors have optimized the doping levels and the shapes as viewed from the top, of the various layers as well as the shape of the shorting holes. This was done in order to optimize the various desired parameters of such a cathode-gate thyristor, such as its breakdown voltage and its switching-on and switching-off parameters.

FIG. 2 illustrates some of these parameters.

If the anode-cathode voltage is a positive voltage equal to V1 and if a gate voltage is applied, as shown by curve 10, the anode-cathode current rapidly increases. Then, the voltage drops to a low value until the voltage and the current are established at V2, I2, which correspond to the parameters of the circuit that the thyristor is inserted into. Then, the thyristor remains in this state even if the gate current is interrupted. The thyristor is said to be sensitive to switching-on if a low gate-cathode voltage and a small flow of current in the gate are sufficient to trigger the on state.

To turn off the thyristor, the voltage across its terminals must decrease until the current flowing in the thyristor becomes lower than a hold current IH.

Additionally, the thyristor has a given forward breakdown voltage; that is, if in the absence of a gate current the voltage exceeds a threshold value $V_{BR}$, the thyristor breaks down and the voltage-current characteristic curve corresponds to curve 11. In addition, this thyristor breakdown voltage depends on the rapidity of the voltage surge, this characteristic corresponds to the dV/dt sensitivity of the thyristor.

The above parameters of a thyristor (switching-on sensitivity, dV/dt sensitivity and hold current) are of primary importance. However, these various parameters are contradictory. More particularly, by decreasing the rate of emitter shorts, the sensitivity to the switching on is increased, whereas by increasing this rate, the problems associated with dV/dt triggering are decreased, and hold current IH is increased.

However, with structures including thyristors having a common anode and a gate that is biased with respect to the cathode, as illustrated in FIG. 1, it has been possible to satisfactorily optimize all these parameters. It is known that it is possible to further increase the switching-on sensitivity by providing cathode-gate amplification thyristors (also called darlistors).

In some applications, it is desirable to obtain thyristors in which the gate electrode is on the side of the anode metallization so that the cathode metallization is alone on a surface of the component and can be directly mounted on a heat sink. It would be possible to use anode-gate thyristors. However, the fabrication of such thyristors raises problems that are presently not well solved.

Indeed, it has generally been asserted in patents that an equivalent structure to a cathode-gate thyristor could be obtained by inverting all the conductivity types of N-type and P-type layers. However, despite these statements, there is in fact no equivalence between an N-type layer and a P-type layer. More particularly, the mobility of the carriers is different in an N-type layer than in a P-type layer, and it is not possible to obtain doping levels in N-type layers equal to doping levels in P-type layers. For example, it is difficult to obtain very highly doped levels for P-type layers.

The solution that would consist in transforming the thyristor shown in FIG. 1 into an anode gate thyristor by inverting all the conductivity types is not satisfactory, especially due to the fact that it would be impossible to substitute a very highly doped P-type layer for layer N1.

Another solution for providing an anode-gate thyristor is illustrated in FIG. 3 in which layer P1 including the cathode-gate is changed into an anode layer P2. The substrate N2 in this case operates as an anode gate. Layer P1 becomes an unconnected cathode-gate layer, and the cathode layer N1 is formed on the side of the lower surface. Such an arrangement provides a rather little unsensitive structure due to the fact that the gate is connected to a very thick layer N2 (the substrate) that is the layer that determines the breakdown voltage.

Thus, in practice, cathode-gate thyristors, such as the thyristor illustrated in FIG. 1, are predominantly available, and there are practically no anode-gate thyristors. Therefore, it is simply possible to form circuits in which several parallel thyristors have a common anode that is connected to a heat sink. However, it is very difficult to connect in parallel thyristors having a common cathode.

A further drawback of anode-gate thyristors is that, even if it were possible to fabricate efficient anode-gate thyristors, they inherently would have a gate biased with respect to their anode, whereas, in many electrical circuits, it is desirable to bias the gate with respect to the cathode and not to the anode.

SUMMARY OF THE INVENTION

A first object of the invention is to provide a thyristor whose cathode corresponds to a first main surface of a semiconductor chip (lower surface) and whose gate is disposed on the surface including the anode, while the thyristor is triggered by a voltage applied to the gate with respect to the cathode.

Another object of the present invention is to provide such a thyristor that has a high switching-on sensitivity, a low dV/dt sensitivity, and a high hold current.

To achieve these and other objects, the present invention provides a thyristor comprising a vertical thyristor including on its front surface a localized anode region and on its rear surface a cathode metallization substantially coating the whole rear surface. In addition, the front surface includes a lateral thyristor. The thyristor gate corresponds to the cathode region or to the cathode-gate region of the lateral thyristor. The cathode-gate region or cathode region, respectively, of the lateral thyristor is connected to the cathode of the vertical thyristor.

In other words, the invention provides a thyristor including an N-type substrate; on the front surface, a P-type anode region coated with an anode metallization; on the rear surface, a P-type layer, in which is formed an N-type cathode region, this rear surface being coated with a cathode metallization, the assembly of these layers forming a vertical thyristor; in the substrate, on the front side, a P-type well in which is formed an N-type region, forming with the substrate and the anode region a lateral thyristor; a gate terminal electrically connected to said P-type well or said N-type region; and an electric connection between the cathode and said N-type area or said P-type well, respectively.

According to an embodiment of the invention, the cathode region of the vertical thyristor is provided with emitter shorts, and the cathode region of the lateral thyristor is free of emitter shorts.

According to an embodiment of the invention, a P-type peripheral region extends from the upper side to the lower side of the thyristor.

According to an embodiment of the invention, a connection between the cathode-gate region of the lateral thyristor and the cathode metallization is formed by a continuous region between the gate region and the peripheral region.

According to a different embodiment of the invention, a connection between the cathode region of the lateral thyristor and the cathode metallization is made by a metallization joining the cathode of the lateral thyristor to the upper surface of the peripheral region.

The present invention also provides an assembly of thyristors having common gates and common cathodes. The assembly is constituted by the parallel connection of thyristors such as defined above, the cathodes of such thyristors being mounted on a same heat sink.

According to an embodiment of the invention, the thyristors having common gates and common cathodes are monolithically assembled. Several vertical thyristors are assembled in parallel in a same substrate. The assembly includes additional common regions including the cathode-gate and the cathode of a lateral thyristor that are prolonged by the anode-gate region and anode region of each vertical thyristor.

The foregoing and other objects, features, aspects and advantages of the invention will become apparent from the following detailed description of the present invention when taken in conjunction with the accompanying drawings.

In the various cross-sectional views of the semiconductor components, sizes are not drawn to scale; more particularly the thicknesses and lateral dimensions of the layers are arbitrarily enlarged or reduced to facilitate the legibility of the drawings.

DETAILED DESCRIPTION

Figure 1:
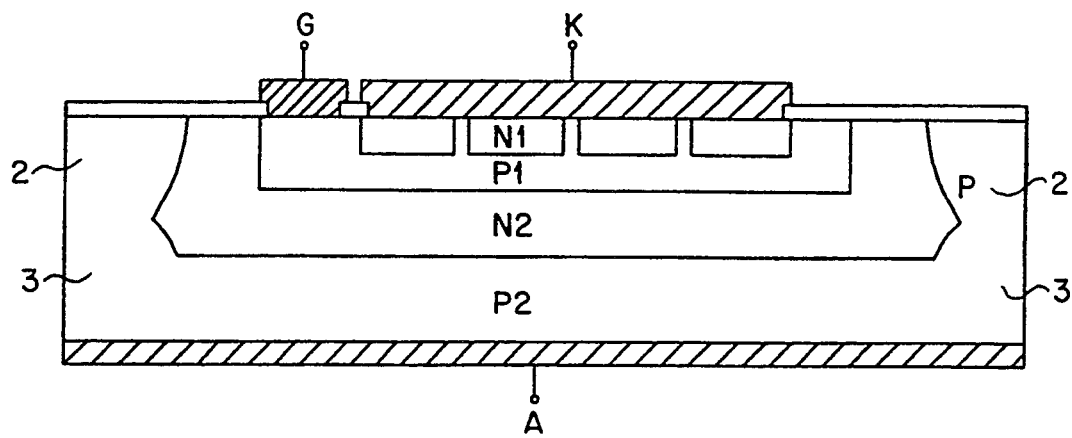
FIGS. 1-3, above described, illustrate the state of the art and the problem encountered.
Figure 2:
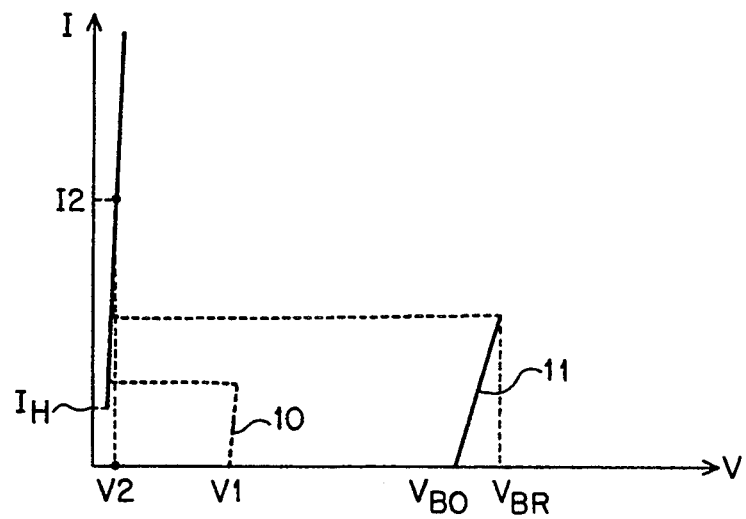
Figure 3:
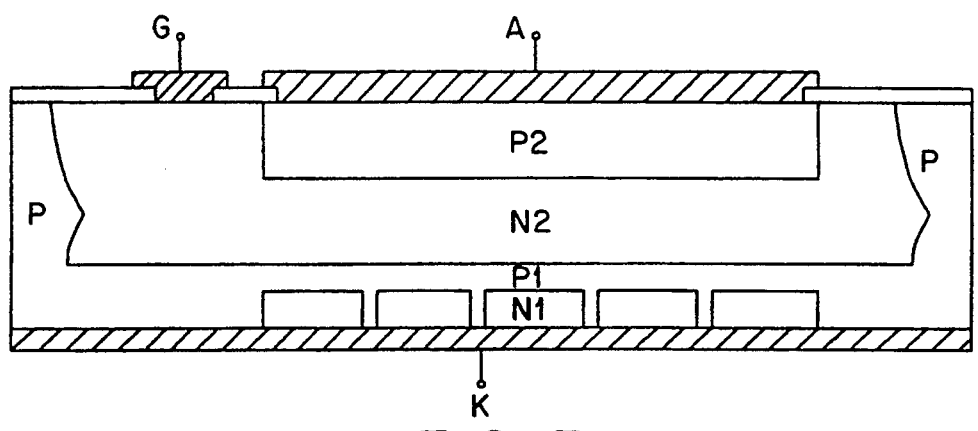
Figure 4:
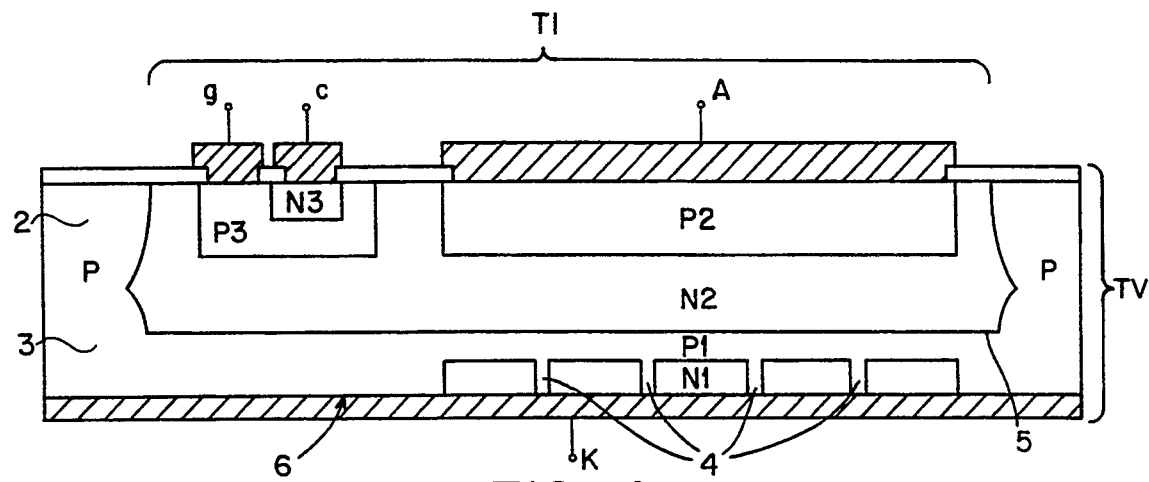
FIG. 4 is a cross-sectional view of a thyristor according to the invention.

FIG. 4 is a cross-sectional view of a thyristor according to the invention. Such thyristor is fabricated from an N-type substrate N2 having its rear surface 5 coated with a P-type layer P1 in which is formed an N-type region N1 that can, conventionally, be interrupted in order to form emitter short regions 4. The rear surface 6 is coated over substantially its whole surface with a cathode metallization K. Region N1 faces a region P2 that is formed from the upper surface of substrate N2. Region P2 forms the anode of a thyristor and is coated with an anode metallization A. Additionally, in region N2, is formed a P-type well P3 inside which is formed an N-type region N3. Well P3 is integrated with a metallization g, and region N3 is integrated with a metallization c.

Thus, the thyristor of FIG. 4 has on its rear surface a single cathode metallization K; its front surface includes an anode metallization A and additional metallizations g and c.

FIG. 4 shows a vertical thyristor TV including layers P2, N2, P1 and N1, and a lateral thyristor t1, on the front surface, including layers N3, P3, N2, P2. Region N1 is conventionally provided with emitter shorts 4 so that the main thyristor TV has a high hold current IH and a high insensitivity to dV/dt triggering. On the other hand, region N3 is not provided with emitter shorts to ensure that the lateral thyristor t1 has a high switching-on sensitivity.

It is clear for those skilled in the art that the largest portions of the upper and lower surface regions of the component are occupied by regions P2 and N1, respectively.

The structure of FIG. 4 can have two different connection modes.

Figure 5A:
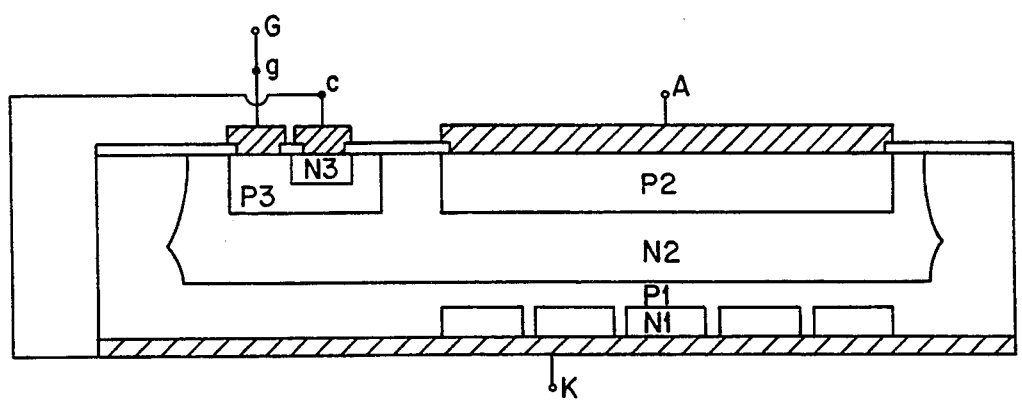
FIG. 5A is a cross-sectional view representing a first connection mode of a thyristor according to the invention.

In a first mode, illustrated in FIG. 5A, terminal c is connected to terminal K, and terminal g forms the gate terminal G of the device.

Figure 5B:
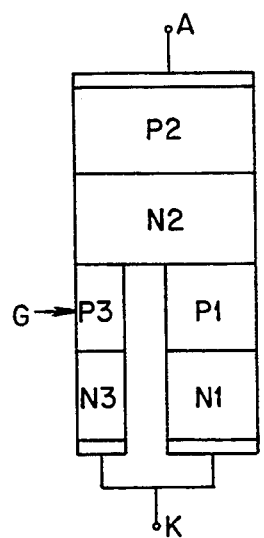
FIGS. 5B and 5C are equivalent diagrams.
Figure 5C:
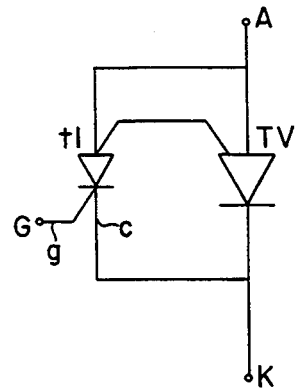

The operation of the device in this first connection mode will be explained with reference to the equivalent layer diagram of FIG. 5B or to the equivalent circuit diagram of FIG. 5C. The lateral thyristor P2-N2-P3-N3, and the vertical thyristor P2-N2-P1-N1 have common anode layers and anode-gate layers. Their cathodes N3 and N1 are interconnected. Thus, when the voltage between terminals A and K is positive and a signal is applied to terminal G, the lateral thyristor P2-N2-P3-N3 becomes conductive between terminals A and K. Immediately afterwards, since a current flows between regions P2-N2, the vertical thyristor P2-N2-P1-N1 becomes also conductive. Its triggering can be assimilated to an anode-gate triggering. As soon as the vertical thyristor becomes conductive (due to the fact that it is parallel-connected with the lateral thyristor, that its surface area is much greater, and that its resistance at the conductive state is much lower), the lateral thyristor turns off, the current flowing therethrough becoming lower than its hold current.

In short, the overall structure as viewed from terminals A, K and G (g) operates as a cathode-gate thyristor in which triggering is obtained by applying a gate voltage that is positive with respect to the cathode voltage. An advantage of this structure, in addition to the fact it allows mounting a cathode on a heat sink, is that the switching-on parameters, that is, the sensitivity to the gate current, are associated with the lateral thyristor t1, whereas the switching off or parasitic triggering parameters (hold current IH and dV/dt sensitivity) are associated with the structure of the vertical thyristor TV. It is therefore possible to independently optimize these various parameters.

Figure 6A:
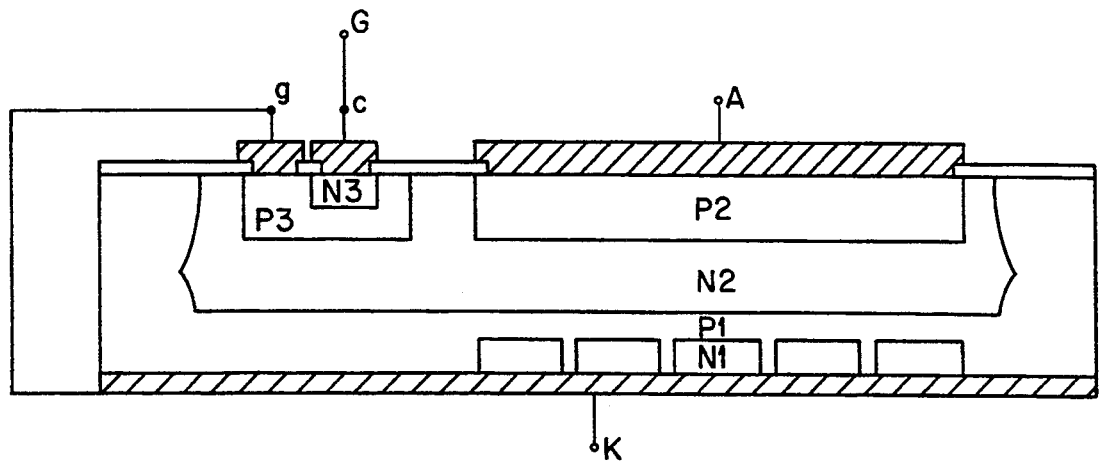
FIG. 6A is a cross-sectional view representing a second connection mode of a thyristor according to the invention.

In a second mode illustrated in FIG. 6A, terminal g is connected to terminal K, and terminal c forms the gate terminal G of the device.

Figure 6B:
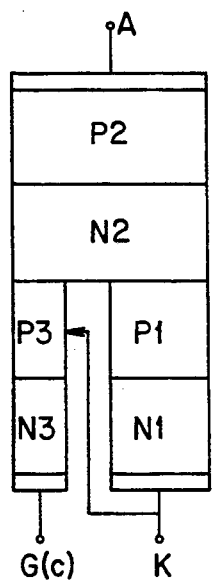
FIGS. 6B and 6C are equivalent diagrams.
Figure 6C:
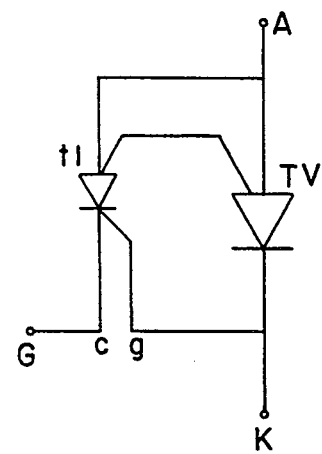

The operation of the device in this second connection mode will be explained with reference to the equivalent layer diagram of FIG. 6B or to the equivalent circuit diagram of FIG. 6C. The lateral thyristor P2-N2-P3-N3 and the vertical thyristor P2-N2-P1-N1 have common anode layers P2 and common anode-gate layers. The cathode-gate layer of the lateral thyristor is connected to the cathode K of the vertical thyristor. The lateral thyristor t1 triggers if its anode P2 is positive with respect to its cathode N3, and if the voltage at terminal G (or c) is negative with respect to the voltage at terminal K. Then, as described above, the vertical thyristor TV triggers and the lateral thyristor t1 turns off.

Therefore, a structure operating as a cathode-gate thyristor is again provided; but in such structure, triggering occurs when the gate is negative with respect to the cathode. Additionally, as described above, the switching-on parameters are separated from the switching-off and parasitic triggering parameters.

In practice, the device according to the invention can be fabricated in various ways, more particularly regarding the connection between terminal g or c and the cathode terminal (the rear surface region).

The device of FIG. 4 can be disposed in a casing, the four terminals A, K, g and c being accessible, and the user can choose to externally connect terminal g or c to terminal K. This solution is advantageous because, in case of inappropriate connection, there is no risk that the circuit may be damaged or destroyed. Simply, if the user applies a positive gate voltage to the connection of terminal g to terminal K, or a negative voltage to the connection of terminal c to terminal K, the component will not operate and it will be sufficient to change the polarity of the control voltage or to invert the connections.

The connection can be made inside the casing by a metal conductor, such as an aluminum wire.

Figure 7:
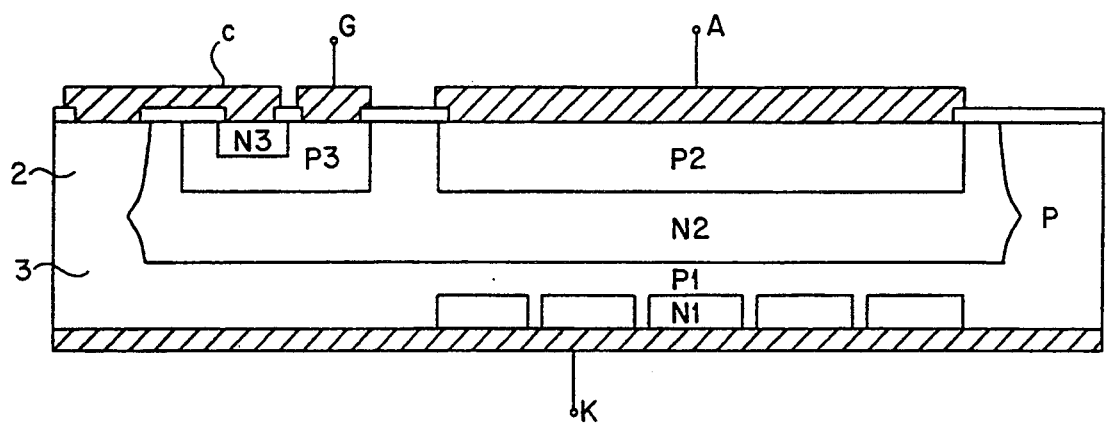
FIG. 7 represents an exemplary embodiment of the thyristor of FIG. 5A.
Figure 8:
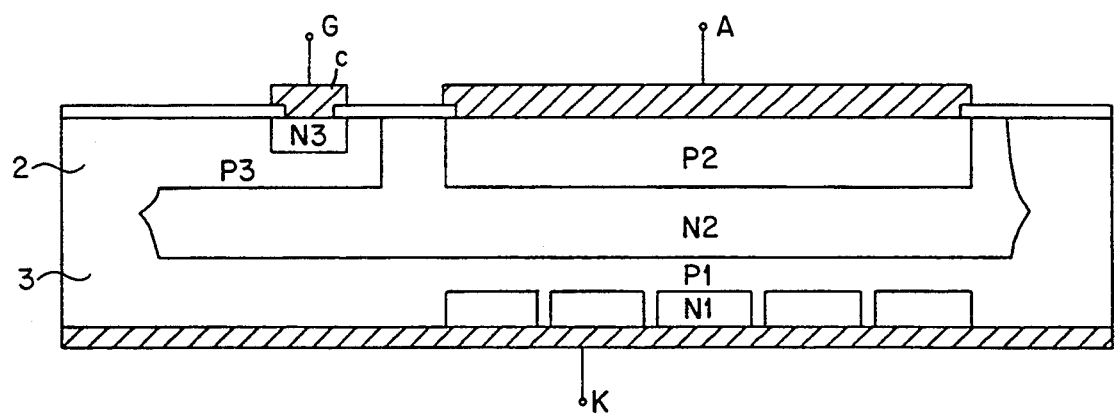
FIG. 8 represents an exemplary embodiment of the thyristor of FIG. 6A.

The connection can be made in an integrated manner, as shown in FIGS. 7 and 8.

FIG. 7 corresponds to an integrated embodiment of the circuit of FIG. 5A. In this embodiment, the cathode metallization c of the lateral thyristor t1 extends so as to contact the P-type lateral diffusion (2–3) contacting the rear surface layer P1. In this embodiment, metallization c is not connected to an external terminal.

FIG. 8 corresponds to an integrated embodiment of the circuit of FIG. 6A. In this embodiment, region P3 extends so as to contact the peripheral diffusion 2–3 extending from the front surface to the rear surface region, and metallization c correspond to the thyristor control terminal G according to the invention.

Of course, the various cross-sectional views of FIGS. 4, 5A, 6A, 7 and 8 are given by way of illustration only and, in practice, metallizations c, g and A have not to be necessarily aligned along a section plane.

Figure 9A:
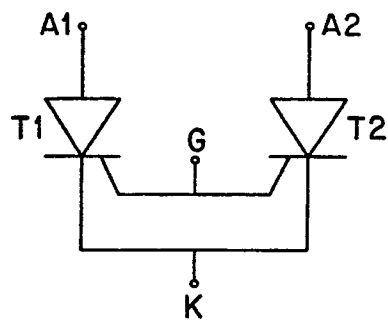
FIGS. 9A and 9B represent exemplary thyristor circuits.
Figure 9B:
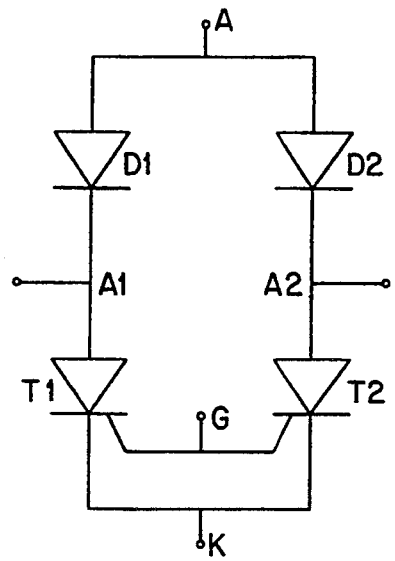

Although the thyristor according to the invention can be used alone, while providing the above described advantages, it has a preferred application in circuits in which two or more thyristors are connected so as to have common cathodes and common gates. Such a circuit including two thyristors T1, T2, having common cathodes K and common gates G is illustrated in FIG. 9A. The anodes of the thyristors are labeled A1 and A2. This arrangement is used, for example, in controlled bridges such as the one illustrated in FIG. 9B where an a.c. voltage is applied between anodes A1 and A2. These anodes are connected to a first d.c. voltage terminal A through respective diodes D1 and D2, and terminal K forms a second d.c. voltage terminal. FIG. 9B represents a single-phase circuit; similarly, it is possible to add a leg in order to form a three-phase circuit.

Figure 10:
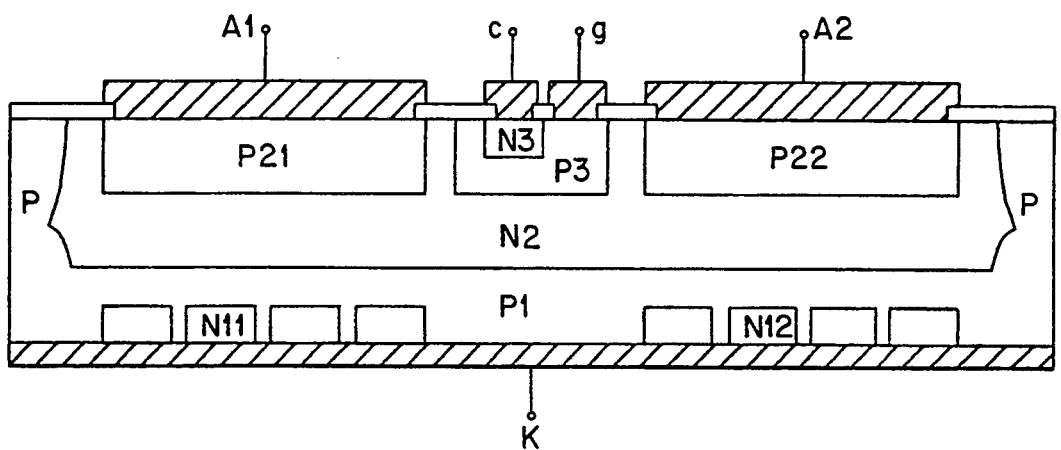
FIG. 10 represents an embodiment according to the invention of an assembly of two parallel thyristors having a common cathode and controlled by a cathode-gate.

To obtain thyristors T1 and T2 having common cathodes mounted on a same heat sink, two thyristors according to the invention could be used in parallel. It is also possible, as represented in FIG. 10, to fabricate an integrated structure in which are shown, on the right-hand and left-hand portion, vertical thyristor structures P21-N2-P1-N11, and P22-N2-P1-N12, respectively, that are similar to the structure of FIG. 4, and in the middle portion, additional regions N3 and P3. Terminal c or terminal g can be connected to terminal K depending on whether it is desired to obtain a control with a gate voltage, that is negative or positive with respect to the cathode voltage. Thus, when a control voltage is applied, either one of thyristors T1 or T2, having an anode positive with respect to the cathode, becomes conductive.

Those skilled in the art will be capable of selecting for each of the structures of FIGS. 4, 5A, 6A, 7, 8 and 10 layer layouts and appropriate doping levels by using conventional design rules. By way of example, the doping levels of the various layers can be as follows:

layer N2: $5 \times 10^{13} - 10^{15}$ atoms/cm$^3$
layer P1, regions P2 and P3: $10^{17} - 10^{19}$ atoms/cm$^3$
regions N1 and N3: $10^{20} - 10^{21}$ atoms/cm$^3$ Although the fabrication would thus be simplified, the doping levels of layers and regions P1, P2 and P3 are not necessarily identical and different values can be selected to optimize some characteristics of the thyristor.

In the above description, the structure according to the invention has been represented as being formed from a thick N-type substrate (a few hundred μm) in which are formed through diffusion or implantation the other layers or regions. However, any known thyristor manufacturing process can be used. For example, it is possible to start from a P-type substrate corresponding to the region P1 on which layer N2 is epitaxially grown.

Additionally, in all the figures, a well-type thyristor structure is illustrated. The present invention also applies to other thyristor structures, such as for example, mesa or planar structures.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A thyristor having a front surface and a rear surface, said thyristor comprising:
   a vertical thyristor including, on the front surface, a localized anode region, and, on the rear surface, a cathode metalization substantially coating the whole rear surface,
   a lateral thyristor formed on the front surface, and
   a thyristor gate corresponding to either a cathode region or to a cathode-gate region of the lateral thyristor, wherein the cathode-gate region or cathode region, respectively, of said lateral thyristor is connected to the cathode of said vertical thyristor.

2. The thyristor as set forth in claim 1 further comprising a P-type peripheral region extending from the front surface to the rear surface.

3. The thyristor as set forth in claim 2, further comprising a connection between the cathode gate region of the lateral thyristor and the cathode metalization, wherein said connection is formed by a continuous region between said cathode gate region of the lateral thyristor and said peripheral region.

4. The thyristor of claim 2 further comprising a connection between the cathode region of the lateral thyristor and the cathode metalization, wherein said connection is made by a metalization bridging the cathode region of the lateral thyristor and the front surface of said peripheral region.

5. The thyristor as set forth in claim 1 wherein a cathode region of the vertical thyristor is provided with emmitter shorts, and wherein the cathode region of the lateral thyristor is free of emitter shorts.

6. A thyristor including:
   an N-type substrate having a front surface and a rear surface;
   on the front surface, a P-type anode region coated with an anode metalization;
   on the rear surface, a P-type layer, in which an N-type cathode region is formed, said rear surface being coated with a cathode metalization, the assembly of the above layers and regions forming a vertical thyristor;
   in the substrate, on the front surface, a P-type well in which an N-type area is formed, said well and area forming with the substrate and the anode region a lateral thyristor;
   a gate terminal electrically connected to either said well or to said area; and
   an electric connection between either the cathode and said area or said well, respectively.

7. The thyristor of claim 6, wherein said cathode region of the vertical thyristor is provided with emitter shorts, and wherein the N-type area of the lateral thyristor is free of emitter shorts.

8. The thyristor as set forth in claim 6 further comprising a P-type peripheral region extending from the front surface to the rear surface.

9. The thyristor as set forth in claim 7 further comprising a P-type peripheral region extending from the front surface to the rear surface.

10. The thyristor as set forth in claim 8 further comprising a connection between the P-type well of the lateral thyristor and the cathode metalization, wherein said connection is formed by a continuous region between said P-type well of the lateral thyristor and said peripheral region.

11. The thyristor of claim 8 further comprising a connection between the N-type area of the lateral thyristor and the cathode metalization, wherein said connection is made by a metalization bridging the N-type area of the lateral thyristor and the front surface of said peripheral region.

12. An assembly of thyristors having common gates and common cathodes, wherein said assembly is constituted by the parallel connection of thyristors, each thyristor having a front surface and a rear surface, and comprising:
   a vertical thyristor including, on the front surface, a localized anode region, and, on the rear surface, a cathode metalization substantially coating the whole rear surface,
   a lateral thyristor formed on the front surface, and
   a thyristor gate corresponding to either a cathode region or to a cathode-gate region of the lateral thyristor, wherein the cathode-gate region or cathode region, respectively, of said lateral thyristor is connected to the cathode of said vertical thyristor,
   and wherein the cathodes of said thyristors are mounted on a same heat sink.

13. A monolithic assembly of thyristors having common gates and common cathodes, wherein each thyristor has a front surface and a rear surface, and comprises:
   a vertical thyristor including, on the front surface, a localized anode region, and, on the rear surface, a cathode metalization substantially coating the whole of the rear surface,
   a lateral thyristor formed on the front surface, and
   a thyristor gate corresponding to either a cathode region or to a cathode-gate region of the lateral thyristor, wherein the cathode-gate region or cathode region, respectively, of said lateral thyristor is connected to the cathode of said vertical thyristor,
   and wherein the several vertical thyristors are assembled in parallel in a same substrate, wherein said cathode region and said cathode-gate region are common to said several vertical thyristors.

14. A thyristor having a front surface and a rear surface, said thyristor comprising:

a vertical thyristor including, on the front surface, a localized anode region, and, on the rear surface, a cathode metalization substantially coating the whole rear surface, a lateral thyristor formed on the front surface, and a thyristor gate corresponding to either a cathode region or to a cathode-gate region of the lateral thyristor, wherein if the thyristor gate corresponds to the cathode region of the lateral thyristor, the cathode-gate region is connected to the cathode of the vertical thyristor, and wherein if the thyristor gate corresponds to the cathode-gate region of the lateral thyristor, the cathode region of the lateral thyristor is connected to the cathode of the vertical thyristor.

15. A thyristor including:

an N-type substrate having a front surface and a rear surface;

on the front surface, a P-type anode region coated with an anode metalization;

on the rear surface, a P-type layer, in which an N-type cathode region is formed, said rear surface being coated with a cathode metalization, wherein the N-type substrate, the P-type anode region, the N-type cathode region, and the P-type layer form a vertical thyristor;

in the substrate, on the front surface, a P-type well in which an N-type area is formed, said well, said area, said anode region and said substrate forming a lateral thyristor;

a gate terminal electrically connected to either said well or to said area; and an electric connection between the cathode metalization and to said area, if the gate terminal is connected to said well, and to said well, if the gate terminal is connected to said area.

* * * * *